United States Patent
Albright

(10) Patent No.: US 10,134,923 B1
(45) Date of Patent: Nov. 20, 2018

(54) PHOTOVOLTAIC DEVICES INCLUDING BI-LAYER PIXELS HAVING REFLECTIVE AND/OR ANTIREFLECTIVE PROPERTIES

(71) Applicant: Global Solar Energy, Inc., Tucson, AZ (US)

(72) Inventor: Scot P. Albright, Tucson, AZ (US)

(73) Assignee: Global Solar Energy, Inc., Tucson, AZ (US)

(*) Notice: Subject to any disclaimer, the term of this patent is extended or adjusted under 35 U.S.C. 154(b) by 0 days.

(21) Appl. No.: 15/965,683

(22) Filed: Apr. 27, 2018

(51) Int. Cl.
 *H01L 31/0216* (2014.01)
 *H01L 31/0224* (2006.01)
 *H01L 31/054* (2014.01)

(52) U.S. Cl.
 CPC ........ *H01L 31/02168* (2013.01); *H01L 31/022433* (2013.01); *H01L 31/0547* (2014.12)

(58) Field of Classification Search
 None
 See application file for complete search history.

(56) References Cited

U.S. PATENT DOCUMENTS

| | | | |
|---|---|---|---|
| 8,319,093 B2 | 11/2012 | Kalkanoglu et al. | |
| 8,519,088 B2 | 8/2013 | Beaujuge et al. | |
| 8,826,607 B2 | 9/2014 | Shiao et al. | |
| 2003/0012936 A1* | 1/2003 | Draheim | C08F 2/44 428/216 |
| 2006/0130889 A1* | 6/2006 | Li | H01L 31/02167 136/244 |
| 2011/0017263 A1 | 1/2011 | Gibson et al. | |
| 2013/0223747 A1 | 8/2013 | Cheng et al. | |
| 2014/0124016 A1 | 5/2014 | Iwasaki et al. | |
| 2014/0261624 A1 | 9/2014 | Cruz-Campa et al. | |
| 2014/0338722 A1 | 11/2014 | Feldman-Peabody et al. | |
| 2017/0098725 A1* | 4/2017 | Imada | H01L 31/0481 |

FOREIGN PATENT DOCUMENTS

| | | |
|---|---|---|
| DE | 202006007909 U1 | 7/2006 |
| EP | 2337090 A1 | 6/2011 |
| JP | 2012-227402 A | 11/2012 |

\* cited by examiner

*Primary Examiner* — Eli S Mekhlin
(74) *Attorney, Agent, or Firm* — Kolisch Hartwell, P.C.

(57) ABSTRACT

PV devices including bi-layer pixels having reflective and/or antireflective properties, and methods for manufacturing PV devices including bi-layer pixels having reflective and/or antireflective properties. In some embodiments, each bi-layer pixel includes a first layer with reflective properties, and a second layer with antireflective properties.

13 Claims, 4 Drawing Sheets

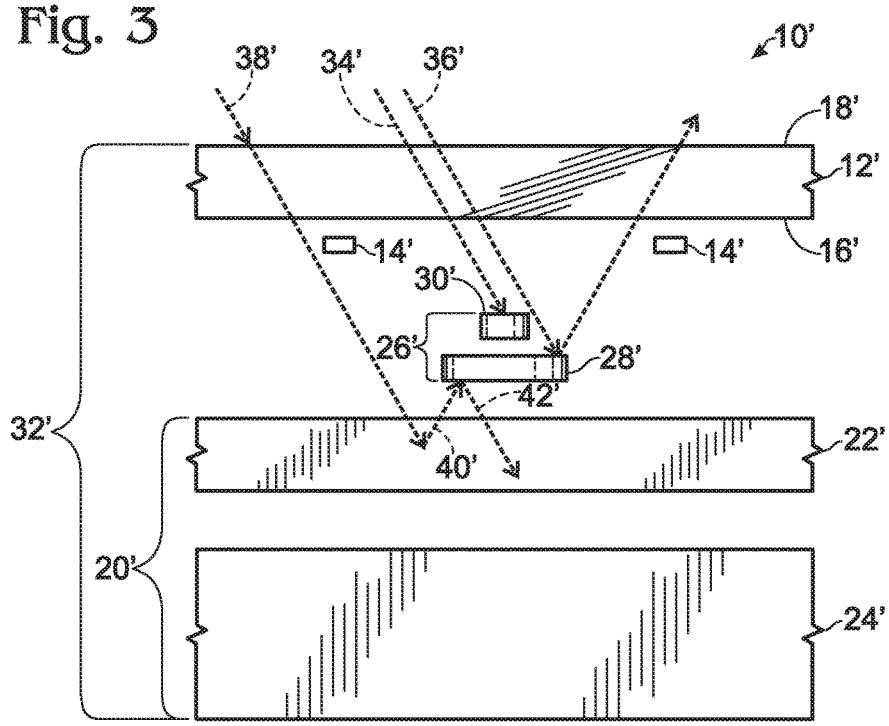
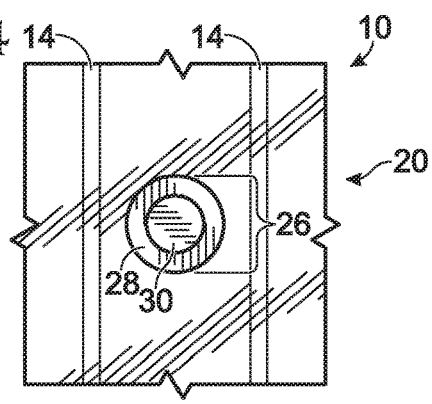
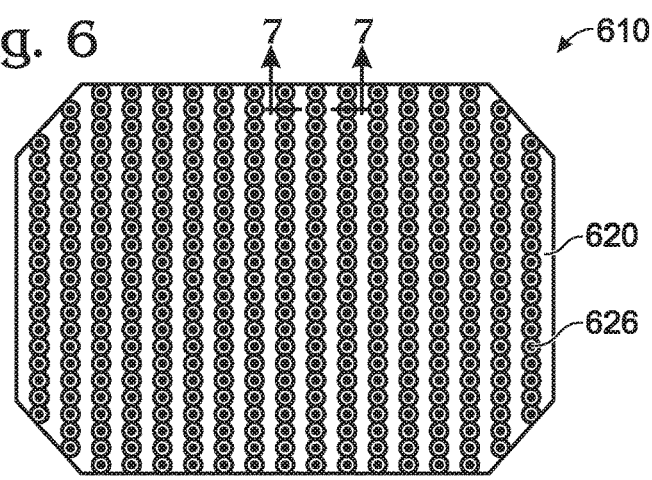

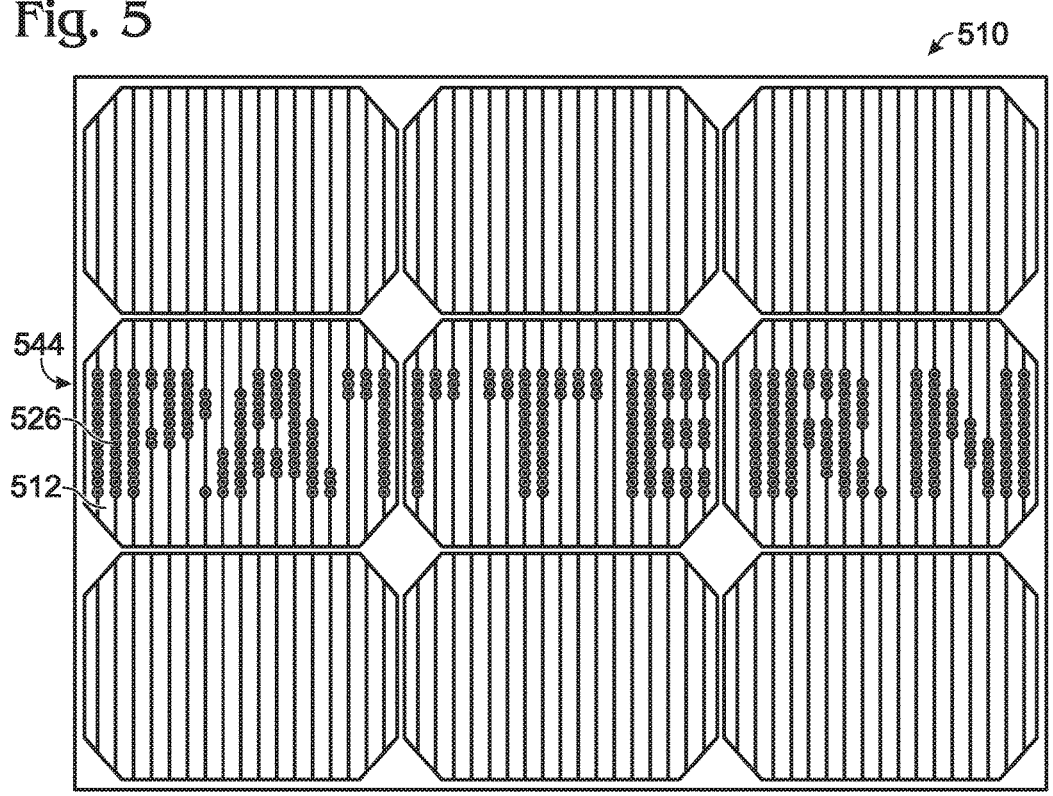
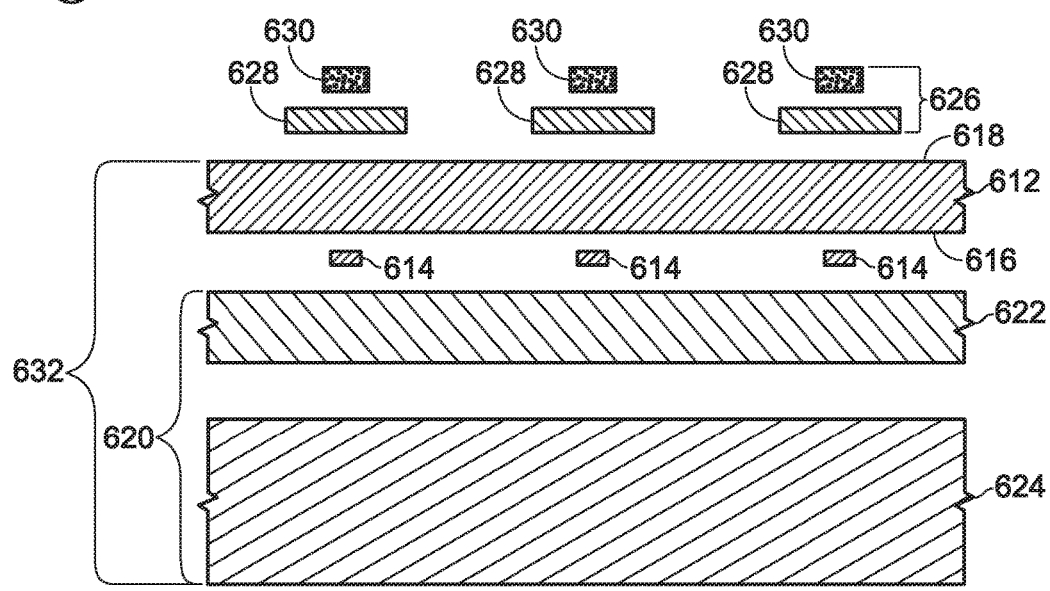

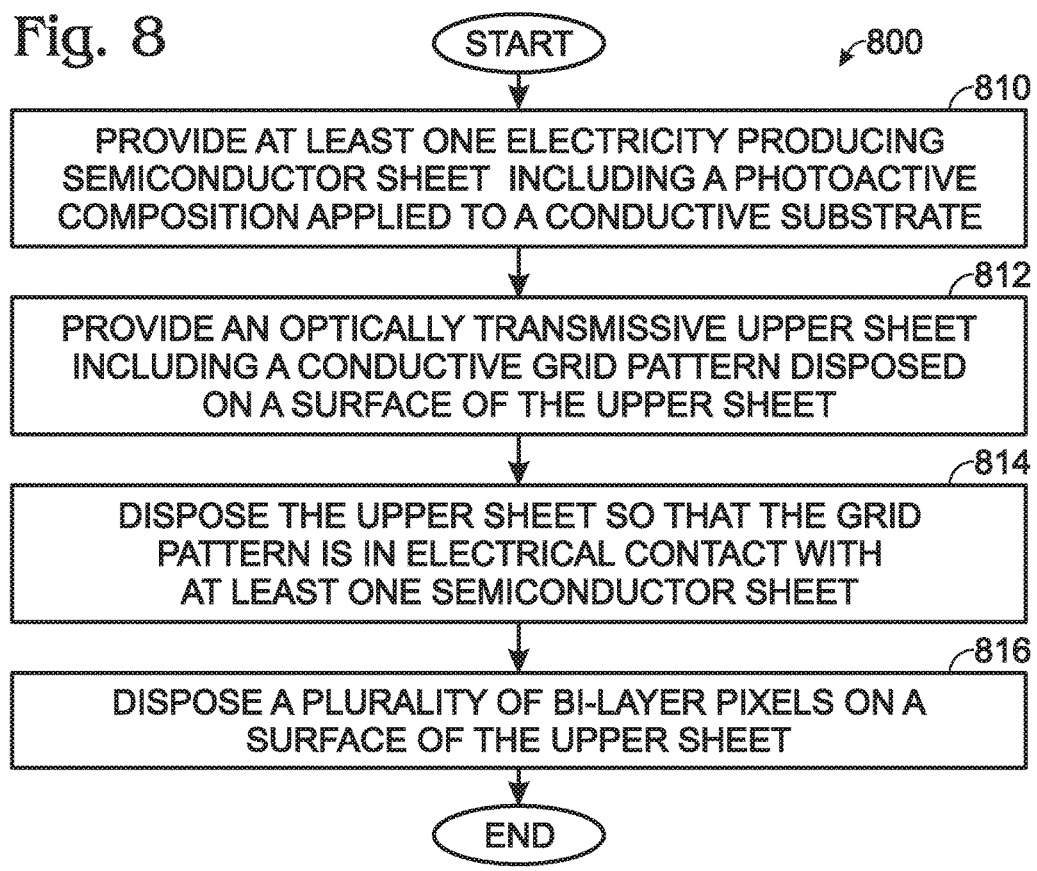

PHOTOVOLTAIC DEVICES INCLUDING BI-LAYER PIXELS HAVING REFLECTIVE AND/OR ANTIREFLECTIVE PROPERTIES

FIELD

This disclosure relates to photovoltaic (PV) devices including bi-layer pixels, and methods for manufacturing PV devices including bi-layer pixels. More specifically, the disclosed embodiments relate to pixels, including layers having reflective and/or antireflective properties, which are suitable for disposal on and/or within the devices.

BACKGROUND

PV devices convert solar energy directly into electrical energy. Such devices generally consist of a single PV cell, or a number of PV cells connected in electrical series to form a PV module, and are typically placed on consumer products or on rooftops of houses, garages, commercial buildings, and other structures to collect solar radiation. One particular type of PV cell is a "thin-film" PV cell, which is widely used in both commercial and residential settings, and composed of two or more thin layers of materials deposited on a conductive substrate. Such layers include but are not limited to a transparent upper sheet, a conductive grid pattern, and an underlying semiconductor structure having more than one layer and capable of absorbing light to produce electricity.

Although PV devices are generally designed with utilitarian principles in mind (e.g., cost and performance of the devices) the visual appearance of the devices may be a concern in some markets. For example, for purposes of marketing to consumers, a producer of PV modules may wish to incorporate visual elements such as colors, patterns, designs, insignias, logos, slogans, wordage, advertisements, photos, etc. into or onto the modules. These visual elements are often pixelated, i.e., composed of a plurality of pixels, using a technique similar to pointillism, which allows for visual elements to be clearly seen while only covering a small percentage of surface area relative to a solid (i.e., non-pixelated) visual element of the same size. Nevertheless, when a pixelated visual element is disposed over an active area of a PV device, there may necessarily be some decrease in device performance due to the pixels blocking incoming sunlight, i.e., preventing radiation from being absorbed within the semiconductor sheet. Accordingly, there is a need for an invention capable of mitigating this decrease in performance.

Further, the aesthetic appeal of PV devices may be a concern in some markets, such as where the devices are marketed directly to consumers (e.g., as portable solar chargers), as well as the architectural market. For example, it may be desirable to mask or attenuate the appearance of certain underlying features of a PV device, such as the conductive grid pattern visible through the transparent upper sheet. The grid pattern may otherwise be highly visible due to contrast in color, reflectivity, etc. between the pattern and the underlying semiconductor sheet, and may be considered aesthetically displeasing to some consumers. Other examples of undesirable underlying features may be blemishes in color and/or texture that may result from the manufacturing process, and glare reflected from an exterior surface or interior portions of the device. Accordingly, there is a need to mask or reduce the visibility of these features while minimizing any resulting decrease in performance of the PV material.

SUMMARY

The present disclosure relates to PV devices including bi-layer pixels having reflective and/or antireflective properties, and methods for manufacturing PV devices including bi-layer pixels having those properties. The pixels may be disposed on the PV devices in any suitable configuration(s), such as to create desired visual elements on the devices (e.g., colors, patterns, designs, logos, etc.), reduce glare reflected from surfaces or interior portions of the devices, and/or mask underlying features of the devices (e.g., grid patterns and/or blemishes in color and/or texture resulting from the manufacturing process). Additionally, in some embodiments, the pixels may include features capable of offsetting any loss of device performance due to pixels blocking incoming sunlight when the pixels are disposed over active areas of the devices.

In some embodiments, the disclosed devices may include a PV cell and/or module including an optically transmissive upper sheet having a conductive grid pattern and a plurality of bi-layer pixels disposed on one or more surfaces of the upper sheet, along with an electricity-producing semiconductor structure applied to a conductive substrate. These components are arranged with the conductive grid pattern of the upper sheet in electrical contact with the semiconductor material.

In some embodiments, the disclosed methods may include providing an electricity-producing semiconductor sheet including a photoactive composition applied to a conductive substrate; providing an optically transmissive upper sheet including a conductive grid pattern disposed on a surface of the upper sheet; disposing the upper sheet so that the grid pattern is in electrical contact with the semiconductor sheet, thereby forming a PV cell; and disposing a plurality of bi-layer pixels on the upper sheet, each pixel including a first layer and a second layer, and having reflective and/or antireflective properties. The bi-layer pixels may be disposed atop portions of the grid pattern to minimize optical transmission loss into the PV cell, or the pixels may be disposed elsewhere. In some embodiments, the disclosed method may further include providing one or more additional semiconductor sheets and electrically interconnecting each semiconductor sheet, via the conductive grid pattern, to form a PV module.

Features, functions, and advantages may be achieved independently in various embodiments of the present disclosure, or may be combined in yet other embodiments, further details of which can be seen in reference to the following description and drawings.

BRIEF DESCRIPTION OF THE DRAWINGS

FIG. 3 is an exploded side view showing a small portion of another photovoltaic cell including a bi-layer pixel disposed on a non-radiation incident surface of an optically transmissive upper sheet of the cell, according to aspects of the present disclosure.

FIG. 4 is a top view showing the photovoltaic cell portions of FIGS. 1-3.

FIG. 5 is a top view showing a photovoltaic module including a plurality of bi-layer pixels disposed on an optically transmissive upper sheet of the module to form a pattern, according to aspects of the present disclosure.

FIG. 6 is a top view showing a photovoltaic cell including a plurality of bi-layer pixels disposed on an optically transmissive upper sheet of the cell to mask an underlying grid pattern of the cell, according to aspects of the present disclosure.

FIG. 7 is an exploded side sectional view showing a small portion of the photovoltaic cell of FIG. 6.

FIG. 8 is a flowchart depicting methods for manufacturing photovoltaic cells and/or modules including bi-layer pixels, according to aspects of the present disclosure.

DESCRIPTION

Overview

Various embodiments of PV devices, i.e., cells and/or modules, are described below and illustrated in the associated drawings. The following description of various embodiments is merely exemplary in nature and is in no way intended to limit the disclosure, its application, or uses. Furthermore, each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Additionally, ordinal indicators, such as first or second, for identified elements are used to distinguish between the elements, and do not indicate a required or limited number of such elements, and do not indicate a particular position or order of such elements unless otherwise specifically stated.

The present disclosure relates to PV cells and/or modules including bi-layer pixels disposed on an exterior surface or within interior layers of the cells and/or modules. For example, the pixels may be disposed on or within a PV device to create desired visual elements (e.g., colors, patterns, designs, logos, slogans, advertisements, photos, etc.), reduce glare reflected from the device, and/or mask undesired visual features of the device such as blemishes in color and/or texture resulting from the manufacturing process, as well as underlying features or components of the device. Additionally, the pixels may include features capable of improving visibility and contrast of any pixelated visual elements, offsetting any decrease in performance of the cells and/or modules caused by radiation being blocked by the pixels, and/or offsetting any decrease in performance of the cells and/or modules caused by radiation being reflected from interior portions of the cells and/or modules without being absorbed, by redirecting reflected radiation back toward a radiation incident surface of the cells and/or modules.

Section 1 below describes general features of the PV cells and/or modules; Section 2 below describes specific features of bi-layer pixels that may be disposed on a surface or surfaces of the PV cells and/or modules; and Section 3 below describes methods for manufacturing PV cells and/or modules that include bi-layer pixels.

1. General Features

Figure 1:
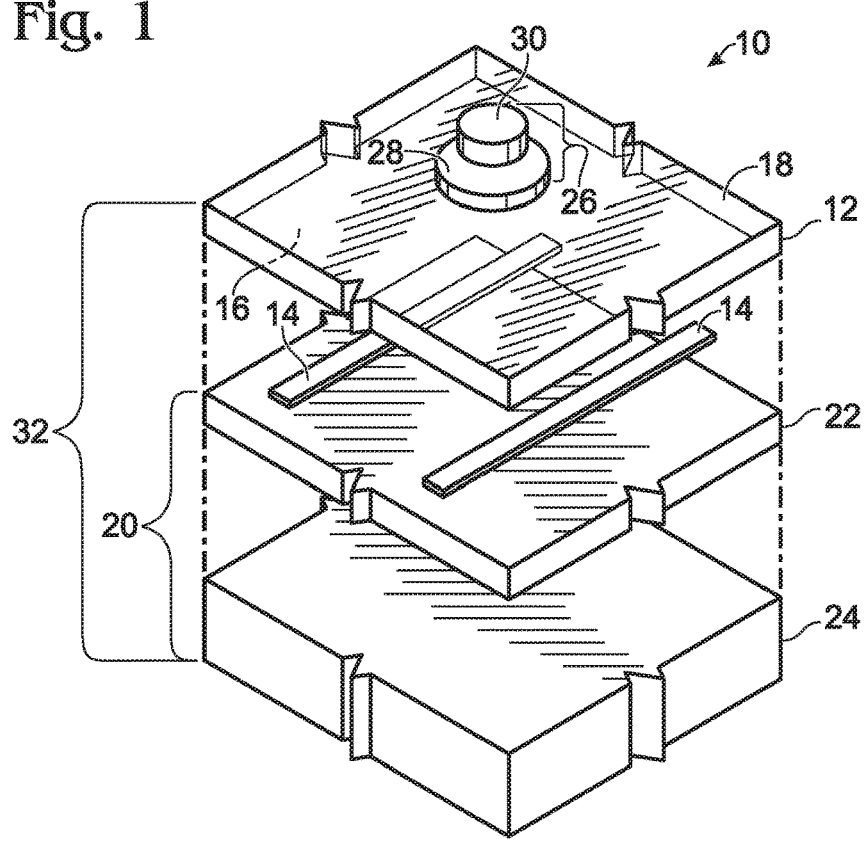
FIG. 1 is an exploded perspective view showing a small portion of a photovoltaic cell including a bi-layer pixel disposed on a radiation incident surface of an optically transmissive upper sheet of the cell, according to aspects of the present disclosure.

This section describes general features of PV cells and/or modules including pixels according to aspects of the present disclosure; see FIG. 1.

FIG. 1 is an exploded perspective view of a portion of a PV cell, generally indicated at 10, according to aspects of the present disclosure. The cell may be electrically interconnected to one or more other cells to form a module (not shown), or in other words, cell portion 10 may also be a portion of a PV module. However, for simplicity, only a small portion of one cell is depicted in FIG. 1. The cell may include an optically transmissive upper sheet 12 with a conductive grid pattern 14 disposed on a surface of upper sheet 12. Surfaces of upper sheet 12 may include a radiation incident surface 18, and a non-radiation incident, or cell-facing, surface 16. Additionally, although grid pattern 14 is shown in FIG. 1 to be configured as substantially parallel strips of conductive material(s), grid pattern 14 may be configured in any suitable pattern.

Upper sheet 12 may include more than one layer. For example, in some embodiments, upper sheet 12 may include layers, such as but not limited to layers of protective coating(s), antireflective coating(s), transparent adhesive(s), and/or the like. Portions of the cell disposed beneath radiation incident surface 18 of upper sheet 12 may be referred to as interior portions 32 of the cell. Interior portions 32 of the cell may include grid pattern 14, which may be disposed on cell-facing surface 16 of upper sheet 12 and in electrical contact with a semiconductor sheet 20, which also may be referred to as semiconductor structure 20. Both grid pattern 14 and semiconductor structure 20 may be visible through the transparent upper sheet 12, as shown in FIG. 1.

Semiconductor structure 20 may include a photoactive semiconductor composition 22 applied to a conductive substrate 24. Semiconductor composition 22 may itself include multiple layers, such as a p-type semiconductor absorber layer overlying an n-type semiconductor buffer layer to form a p-n junction. For example, semiconductor composition 22 may include a p-type semiconductor layer of copper indium gallium diselenide (CIGS) overlying an n-type semiconductor layer of cadmium sulfide (CdS). However, the present teachings may be applied to PV cells and modules using any photoactive semiconductor composition.

FIG. 1 also shows a bi-layer pixel, generally indicated at 26, disposed on a radiation incident surface 18 of upper sheet 12. Pixel(s) 26 may additionally or alternatively be disposed on a cell-facing surface 16 of the upper sheet 12 (see FIG. 3 and the accompanying description below). When viewed from the top (see FIG. 4), pixel(s) 26 may appear substantially the same when disposed on either surface of upper sheet 12 because the upper sheet is optically transmissive. Additionally, although only one pixel 26 is shown in FIG. 1, more generally a cell or module may include a plurality of pixels 26, such as hundreds or thousands, disposed in any suitable configuration on a surface or surfaces of upper sheet 12.

Pixel(s) 26 may have a first layer 28 and a second layer 30. Layer 28 is disposed closer to photoactive composition 22 and with a proximal surface of the layer oriented toward the interior of cell portion 10, i.e., toward the photoactive composition. Layer 30 is disposed on a distal side of layer 28 relative to the remainder of cell portion 10, with its exposed or distal surface facing away from the PV cell. First layer 28 may have a first color and second layer 30 may have a second color, and in some embodiments each layer may have more than one color, and/or any suitable combination of first colors and second colors.

Depending on the application, first layer 28 may have antireflective and/or reflective properties, and second layer 30 also may have antireflective and/or reflective properties. For example, a white pixel layer may be provided to reflect substantial portions of incident visible light, and a black pixel layer may be provided to absorb substantial portions of incident visible light. Other colors may have both reflective and antireflective properties. For example, the color magenta has reflective and antireflective properties because magenta reflects red and blue light and absorbs green light. Pixel layers having any colors may be chosen to provide any degree of reflectivity or anti-reflectivity desired in a particular situation. Furthermore, pixels may be provided with reflective or anti-reflective coatings known in the field of optics, for example based on thin-film interference within the coating.

Selected features of pixel(s) 26 are discussed in more detail in Section 2 below.

Examples, Components, and Alternatives

The following sections describe selected aspects of exemplary PV devices including bi-layer pixels, and methods for manufacturing such PV devices. The examples in these sections are intended for illustration and should not be interpreted as limiting the entire scope of the present disclosure. Each section may include one or more distinct inventions, and/or contextual or related information, function, structures, and/or steps.

2. Bi-Layer Pixels

This section describes in more specificity selected features of bi-layer pixels according to aspects of the present disclosure; see FIGS. 2-7.

Example 1

Figure 2:
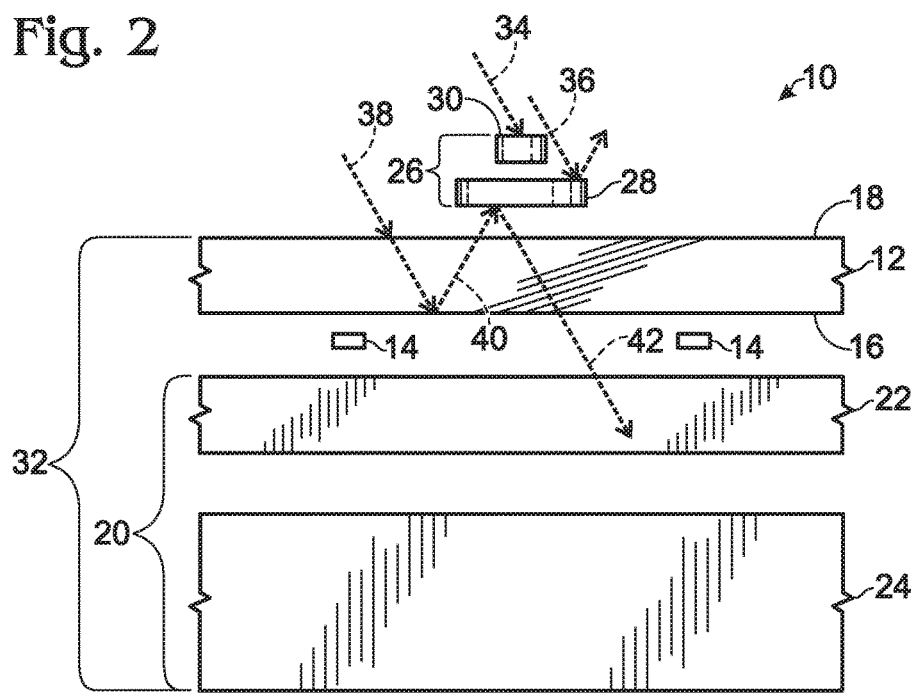
FIG. 2 is an exploded side view showing the photovoltaic cell portion of FIG. 1.

FIG. 2 is a side view of PV cell portion 10 of FIG. 1. As discussed in Section 1 above, pixel(s) 26 may be disposed on radiation incident surface 18 of a transparent upper sheet 12 of the PV cell. Further, each pixel 26 may include a first layer 28 having a first color, and a second layer 30 having a second color that in some cases (but not all) is different from the first color. Exemplary embodiments may include first layer 28 having reflective properties and second layer 30 having antireflective properties. For example, in some embodiments, first layer 28 may have a first color such as white, which is highly reflective, or any other suitable first color having reflective properties. Conversely, second layer 30 may have a second color such as black, which is highly antireflective, or any other suitable second color having antireflective properties. Embodiments may include pixel(s) 26 having more than one first color and/or second color, and/or any suitable combination of first colors and second colors. As mentioned previously, reflective or antireflective coatings also may be used on the pixels.

The properties of pixel(s) 26 may help to offset any loss in performance due to radiation being blocked by pixel(s) 26, and/or due to radiation being reflected from interior portions 32 of the cell without being absorbed. Specifically, when disposed over an active area of the cell, pixel(s) 26 may block incoming radiation, preventing the radiation from reaching an absorber layer within semiconductor sheet 20. Radiation that is not absorbed cannot produce electricity, so that cell performance could be adversely affected. Loss in performance also may be caused by incident radiation reflecting from semiconductor sheet 20 rather than being absorbed by it.

First layer 28 of each pixel 26 may mitigate the loss in performance described above. Specifically, first layer 28, due to its reflective properties, may cause light reflected from interior portions 32 of the cell to be reflected back toward semiconductor sheet 20 for another opportunity to be absorbed and produce electricity. First layer 28 may thus offset any loss in performance due to radiation being blocked by pixel(s) 26, as well as due to radiation being reflected from interior portions 32 of the cell without being absorbed.

Arrows have been drawn in FIG. 2 to indicate ways in which light incident on the cell may be reflected and/or absorbed by the cell. Specifically, arrow 34 indicates light incident on and absorbed by second layer 30 of pixel(s) 26; arrow 36 indicates light incident on and reflected by first layer 28 of pixel 26; arrow 38 indicates light incident on upper sheet 12 and arriving at interior portions 32 of the cell; arrow 40 indicates light reflected from interior portions 32 of the cell back toward radiation incident surface 18 of the cell; and arrow 42 indicates light reflected by first layer 28 of pixel 26, back toward semiconductor sheet 20.

In some embodiments, pixel(s) 26 may be disposed over a non-active area of the cell, such as grid pattern 14. Because cells do not produce electricity due to light incident upon grid pattern 14, masking grid pattern 14 with pixel(s) 26 may result in little to no loss in performance of the cell, with any loss due only to the portion of each pixel that extends into the active area of the cell. However, there still may be some loss in cell performance due to light arriving at interior portions 32 of the cell without being absorbed (see arrow 38) and being reflected from interior portions 32 back toward the exterior of the cell (see arrow 40). Without pixel(s) 26, the light reflected from interior portions 32 of the cell would typically exit the cell without producing electricity. However, the portion of first layer 28 extending into the active area of the cell will reflect some of this light back toward the interior of the cell. Thus, any minor loss in cell performance due to the presence of the pixels may be compensated by the reflectivity of interior layer 28.

Pixel(s) 26 may include features that improve the aesthetic qualities of the cell. For instance, second or exterior layer 30 of the pixels may be configured to reduce the amount of glare reflected from the cell. Specifically, in embodiments including a second layer 30 having antireflective properties, second layer 30 may absorb light incident on the second layer (indicated by arrow 34) instead of reflecting the light to cause glare. Thus, in embodiments including a substantial number of pixels 26 disposed on upper sheet 12 of the cell, the pixels may reduce overall reflected glare from the cell or portions of the cell. Accordingly, some embodiments may include pixels 26 configured in a dense pattern on a surface of upper sheet 12. The dense pattern may, for instance, be disposed over grid pattern 14 of upper sheet 12 in order to reduce glare from the grid pattern. As described previously, because cells do not produce electricity due to light incident upon grid pattern 14, masking grid pattern 14 with pixels 26 may result in little to no loss in performance of the cell.

Example 2

FIG. 3 shows a small portion of another PV cell, generally indicated at 10', including elements that may be substantially identical to elements shown in FIG. 2. Accordingly, for simplicity, corresponding elements in FIG. 3 have been labeled using similar reference characters to the embodiment of FIGS. 1-2, but with the numbers primed. As shown in FIG. 3, in some cases pixel(s) 26' may be disposed on a cell-facing surface 16' of upper sheet 12', rather than on the radiation incident surface of the upper sheet, as depicted in FIGS. 1-2

Arrows have been drawn in FIG. 3 to indicate ways in which light incident on the cell may be reflected and/or absorbed by the cell, which are generally similar to the possibilities in the embodiment of FIGS. 1-2. Specifically, arrow 34' indicates light incident on and absorbed by second or outer layer 30' of pixel(s) 26'; arrow 36' indicates light incident on and reflected by first or inner layer 28' of pixel 26'; arrow 38' indicates light incident on upper sheet 12' and arriving at interior portions 32' of the cell; arrow 40' indicates light reflected from interior portions 32' of the cell back toward radiation incident surface 18' of the cell; and arrow 42' indicates light reflected by first layer 28' of pixel 26', back toward semiconductor sheet 20'.

As in the case of pixel(s) 26 disposed on radiation incident surface 18 of upper sheet 20 in the embodiment of FIGS. 1-2, pixel(s) 26' may be disposed on cell-facing surface 16' of upper sheet 20' in any suitable configuration, to create desired visual elements, reduce glare, and/or mask underlying features of the cell, while the inner layer 28' of the pixels, when chosen to be reflective, may reduce any loss of efficiency that the pixels would otherwise cause.

Example 3

FIG. 4 is a top view showing cell portion 10 of FIGS. 1-2. FIG. 4 can also be considered a top view of cell portion 10' of FIG. 3, because pixel(s) 26 and 26' appear substantially the same when viewed from the top, due to upper sheet 12 being optically transmissive. However, for simplicity, the elements in FIG. 4 have been labeled using only unprimed numbers. As shown in FIG. 4, grid pattern 14 and semiconductor sheet 20 may be visible through upper sheet 12.

Also as shown in FIG. 4, first layer 28 of each pixel 26 may be substantially aligned with second layer 30, such as centered or otherwise justified with respect to the second layer, if the layers of pixel 26 do not have the same size. More specifically, first layer 28 may have a first dimension, and second layer 30 may have a second dimension that is different than the first dimension. In some embodiments, as depicted in FIG. 4 the first dimension may be larger than the second dimension so that an outline of first layer 28 is visible around a perimeter portion of second layer 30.

For example, in embodiments including a first layer 28 having reflective properties, first layer 28 may have a first color that is white. Accordingly, first layer 28 may create a white outline around second layer 30, which has a second color different than white. White outline 30 may improve the contrast and visibility of second layer 30. Alternatively, in embodiments including a first layer 28 having some antireflective properties, first layer 28 may, for example, have a first color that is yellow. Accordingly, the first layer may create a yellow outline around second layer 30, which has a second color different than yellow. Various embodiments may include any suitable combination(s) of first colors and/or second colors.

However, other embodiments may not include a visible outline of first layer 28. Such embodiments may, for example, include a first layer 28 that is substantially the same size or smaller than second layer 30. In such embodiments, first layer 28 may have reflective properties and be configured to capture light to thereby mitigate decrease in cell performance due to pixel(s) 26 being disposed over active areas of the cell, as discussed above in Examples 1-2. Alternatively or in addition, second layer 30 may have antireflective properties and be configured to reduce glare reflected from the cell and/or to mask underlying features of the cell.

Further, although pixel(s) 26 are depicted in FIG. 4 as circular in shape, bi-layer pixels according to the present teachings may, in general, have any appropriate shape, including but not limited to circular, oval, oblong, square, star or asterisk-shaped, and/or rectangular. In addition, the shape need not have an uninterrupted surface, but may instead take the form of a donut or torus. In that case, the radially inner and outer portions of the torus may be black or otherwise anti-reflective, to allow passage of some radiation through the central hole in the torus. The bottom or cell-facing surface of the torus-shaped pixel still may have a first color, and the top of radiation-incident surface of the pixel still may have a second color different from the first color. Exemplary torus-shaped embodiments may include a cell-facing surface having reflective properties and a radiation-incident surface having antireflective properties, as in other embodiments described above.

Example 4

FIG. 5 is a top view showing a photovoltaic module, generally indicated at 510, including a plurality of bi-layer pixels 526 disposed on an optically transmissive upper sheet 512 of module 510. For simplicity, corresponding elements in the embodiment of FIG. 5 have been labeled using similar reference characters to the embodiments of FIGS. 1-4, but with an added leading "5." As shown in FIG. 5, in some embodiments, a plurality of bi-layer pixels 526 may be disposed on a surface or surfaces of an upper sheet 512 of a PV cell and/or module and configured to create one or more visual elements such as color(s), pattern(s), design(s), logo(s), slogan(s), advertisement(s), photo(s), and/or any other appropriate configuration(s), such as the word "PATTERN" generally indicated at 544 in FIG. 5. The visual element(s) may also be disposed on the cell for other purposes, including but not limited to reducing glare reflected from the cell, and/or masking underlying features of the cell, discussed further below.

Example 5

FIG. 6 is a top view showing a photovoltaic cell, generally indicated at 610, and FIG. 7 is an exploded sectional view of a small portion of cell 610. Cell 610 includes a plurality of pixels 626 disposed on an upper sheet 612 of cell 610 to mask grid pattern 614 of the cell, according to aspects of the present disclosure. For simplicity, corresponding elements in the embodiment of FIGS. 6-7 have been labeled using similar reference characters to the embodiments of FIGS. 1-5, but with an added leading "6." As shown in FIGS. 6-7, pixel(s) 626 may be disposed on upper sheet 612 to mask underlying features of the cell such as grid pattern 614, blemishes in color and/or texture that may result from the manufacturing process, and/or any other suitable underlying feature. In such embodiments, pixels 626 may be configured in a dense pattern to mask the underlying features.

For example, pixels 626 are shown overlying the lines of grid pattern 614 in FIGS. 6-7, which may reduce unwanted contrast or otherwise change the aesthetic appearance of cell 610. Specifically, cells without any masking pixels may include a plainly visible grid pattern 614 due to visible contrast between grid pattern 614 and underlying semiconductor sheet 620. For example, although grid pattern 614 and semiconductor sheet 620 are shown in FIGS. 6-7 without color, grid pattern 614 may include a conductive material and thus appear metallic in color, and semiconductor sheet 620 may include a material such as silicon and thus appear gray in color. Accordingly, grid pattern 614 may be plainly visible and considered aesthetically displeasing by some consumers for that reason. However, masking grid pattern 614 by disposing pixels 626 over grid pattern 614, as shown in FIGS. 6-7, may reduce the visible contrast, thereby improving or at least changing the aesthetic properties of the cell. Because cells do not produce electricity due to light incident upon grid pattern 614, masking grid pattern 614 with pixels 626 may result in little to no loss in performance of the cell.

Further, pixels 626 may include a first layer having reflective and/or antireflective properties, and a second layer having reflective and/or antireflective properties, which serve the same purposes described with respect to previous examples. In some embodiments, pixel(s) 626 may improve aesthetic properties of the cell by reducing reflected glare from pixel(s) 626 and/or cell as a whole. Specifically, the upper layer of each pixel may have antireflective properties, and thus may absorb light incident on the upper layer instead of reflecting the light and thereby causing glare. Accordingly, a plurality of pixels 626 may be disposed on a surface of the cell and configured to reduce glare reflected from the entire cell.

FIG. 7 is an exploded side sectional view showing a small portion of cell 610 of FIG. 6. As shown in FIG. 7, pixel(s) 626 may be disposed on radiation incident surface 618 of upper sheet 612 to mask underlying grid pattern 614, which may be disposed on cell-facing surface 616 of upper sheet 612. An outward facing layer 630 of each pixel may have antireflective properties, whereas an inward facing layer 628 of each pixel may be more reflective than outward facing layer 630. Additionally, layer 628 may have a larger dimension than layer 630, and may be substantially aligned with layer 630 so that an outline of layer 628 is visible around a perimeter portion of layer 630.

Pixel layer 628 may have substantially the same color as photoactive composition 622 of semiconductor sheet 620. For example, semiconductor sheet 620 may be gray in color when the cell is viewed from above. Accordingly, pixel layer 628 may have a first color that is gray. Gray is semi-reflective, i.e., has reflective properties as well as antireflective properties. Accordingly, a gray inward facing layer 628 may improve cell performance through inward reflection, as described with respect to Example 1 above. Thus, semi-reflective layer 628 may offset any loss in performance due to radiation being blocked by pixel(s) 626, through secondary reflection of radiation reflected from interior portions 632 of the PV cell or module. However, alternative embodiments may include an inward facing layer 628 having any suitable antireflective and/or reflective color or combination of colors, as well as any suitable dimension and alignment relative to outward facing layer 630.

3. Methods for Manufacturing PV Cells and/or Modules Including Bi-Layer Pixels

This section describes exemplary methods for manufacturing PV cells and/or modules including bi-layer pixels according to aspects of the present disclosure; see FIG. 8.

Structural elements used in conjunction with the methods described in this section may be substantially the same as corresponding elements described in detail in Sections 1-2 above. Accordingly, such elements will not be described again in detail in Section 3.

Example 6

FIG. 8 is a flowchart depicting a method for manufacturing PV cells and/or modules including bi-layer pixels, generally indicated at 800, according to aspects of the present disclosure. Certain steps of the method may be performed in any suitable order. For example, a plurality of bi-layer pixels may be disposed on a surface of a PV cell and/or module as either an intermediate and/or a final step. More specifically, some embodiments of method 800 include disposing a plurality of pixels onto the cell and/or module as a final step, i.e., after the cell and/or module is substantially assembled. However, in other embodiments, one or more pixels may additionally be disposed within layers of the cell and/or module as an intermediate step, i.e., before assembly of the cell and/or module is substantially complete.

A first step 810 of method 800 may include providing at least one electricity-producing semiconductor sheet including a photoactive composition applied to a conductive substrate. In some embodiments, two or more semiconductor sheets may be provided. Additionally, in some embodiments, the semiconductor sheet(s) may be manufactured as part of the present teachings by applying a photoactive composition to a conductive substrate. In other embodiments, the semiconductor sheet(s) may be readily available and thus not require manufacturing. For example, the semiconductor sheet(s) may be pre-manufactured and available for use and/or purchase by entities such as commercial producers of PV modules, individual consumers, students, etc. Embodiments having more than one semiconductor sheet may include a mixture of manufactured and pre-manufactured semiconductor sheets.

A second step 812 of method 800 may include providing an optically transmissive upper sheet including a conductive grid pattern disposed on a surface of the upper sheet. In some embodiments, the upper sheet may be manufactured as part of the present teachings by disposing a conductive grid pattern on a surface of the upper sheet. In other embodiments, an upper sheet already including a conductive grid pattern may be available and thus may not require manufacturing. In other words, the upper sheet may be pre-manufactured and available for use and/or purchase, including a conductive grid pattern. The surface of the upper sheet on which the grid pattern is disposed will generally be a cell-facing surface so that the grid pattern can be positioned in electrical contact with the semiconductor sheet. Steps 810 and 812 can be performed in any order.

Regardless of the order in which steps 810 and 812 are performed, a third step 814 of method 800 may include disposing the upper sheet so that the grid pattern of the upper sheet is in electrical contact with the semiconductor sheet(s). In embodiments including only one semiconductor sheet, disposing the grid pattern in electrical contact with the semiconductor sheet may form a PV cell. However, the at least one semiconductor sheet may include any suitable number of semiconductor sheets. In embodiments including more than one semiconductor sheet, disposing the grid pattern in electrical contact with each semiconductor sheet may electrically interconnect the semiconductor sheets to thereby form a PV module.

A subsequent step 816 of method 800 may be to dispose a plurality of bi-layer pixels on a surface of the upper sheet. Generally, in embodiments wherein the pixels are placed on the upper sheet after the PV cell and/or module is assembled, the pixels will be disposed on the radiation incident (outward facing) surface of the upper sheet. In other embodiments, the pixels may be placed on the upper sheet before the cell or module is assembled, in which case the pixels may be disposed on the inward facing surface of the upper sheet. In some cases, the pixels may be disposed on the inward facing surface of the upper sheet before the conductive grid pattern is applied to the upper sheet, in which case the conductive grid pattern will overlay the pixels.

In some embodiments, the pixels may be disposed on the topmost (or exterior) layer of the cell and/or module, which may or may not be the upper sheet. Additionally or alternatively, the pixels may be disposed within layers of the cell and/or module. For example, in some embodiments, additional layers, such as protective layers, may be disposed either underneath or on top of the pixels. Any such additional layers would necessarily be optically transparent so that radiation incident on the cell can reach the underlying photoactive composition of the PV cell or module.

Bi-layer pixels may be formed on the upper sheet in any suitable manner. For example, in some embodiments, the pixels may be printed on the upper sheet. In other embodiments, the pixels may be deposited on the upper sheet manually and/or by using automated machinery, and attached with adhesives, heat welding, or any other suitable method. Some embodiments may include bi-layer pixels that are pre-assembled, i.e., wherein the second layer of each pixel is pre-disposed on a surface of the first layer of each pixel. Additionally or alternatively, some embodiments may include placement of the second pixel layer onto the first pixel layer after the first layer has been positioned on the upper sheet.

For example, in embodiments wherein the pixels are disposed on a radiation incident surface of the upper sheet, a first layer may be deposited onto the upper sheet and a second layer may subsequently be deposited onto the first layer. Similarly, in embodiments wherein the pixels are disposed on a cell-facing surface of the upper sheet, a first layer may be deposited onto the upper sheet and a second layer may subsequently be deposited onto the first layer, but the properties of the layers may be altered accordingly. For example, to reduce glare, an antireflective pixel layer may be positioned as an uppermost layer, to receive solar radiation before the other pixel layer. This uppermost layer will be deposited second for pixels disposed on the radiation incident side of the upper sheet, but first for pixels disposed on the cell-facing side of the upper sheet. Generally speaking, embodiments may include pixels deposited on both or either of the surfaces of the upper sheet. Additionally, in some embodiments, the first layer may be pre-disposed on the second layer (or vice versa) so that both layers of the pixel may be deposited on surface(s) of the upper sheet in substantially the same step.

According to aspects of the present teachings, bi-layer pixels may be disposed on a surface of the upper sheet in any suitable configuration. For example, in some embodiments, the pixels may disposed on the cell and/or module to create one or more desired visual elements. In such embodiments, each pixel may be configured to be spaced apart from each other so that the desired visual element is created using a method similar to pointillism. The pixels may also be disposed over one or more underlying features of the cell and/or module to mask the underlying feature(s) of the cell and/or module, such as blemishes in color and/or texture resulting from the manufacturing process. In such embodiments, the pixels may further be configured to create one or more desired visual elements or simply to match the color of the cell and/or module.

In other embodiments, the pixels may be disposed on the cell and/or module to mask an underlying collection grid pattern, to reduce contrast between the grid pattern and surrounding cell, or to otherwise change the visual appearance of the grid pattern. In such embodiments, the pixels may, for example, have antireflective properties, match the color of the cell and/or module, and/or be disposed on the upper sheet in a dense pattern.

In yet other embodiments, bi-layer pixels may be disposed on a PV cell and/or module to improve cell and/or module performance by light capturing. Specifically, as discussed in detail in Section 2 above, pixels disposed over an active area of a cell and/or module may cause some decrease in cell and/or module performance due to the pixels blocking radiation from reaching a portion of the semiconductor sheet where the radiation can be absorbed to thereby produce electricity. Including a reflective first layer may mitigate this loss of performance due to light capturing, relative to the use of single layer or non-reflective pixels.

To reiterate, the steps of method 800 may be performed in any suitable order. Specifically, the stop of depositing bi-layer pixels onto the upper sheet may be performed either before or after the upper sheet is assembled with the underlying semiconductor material, and if bi-layer pixels are deposited onto the upper sheet before the sheet is attached to the semiconductor material, the pixels may be deposited onto either side of the upper sheet.

Example 7

This section describes additional aspects and features of methods for manufacturing PV cells and/or modules including bi-layer pixels, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A0. A photovoltaic cell, comprising:
  an optically transmissive upper sheet including a conductive grid pattern disposed on a surface of the upper sheet;
  an electricity-producing semiconductor sheet including a photoactive composition applied to a conductive substrate, disposed with the conductive grid pattern of the upper sheet in electrical contact with the semiconductor sheet; and
  a plurality of bi-layer pixels disposed on a surface of the upper sheet, wherein the pixels each include a first layer and a second layer, and wherein the first layer has reflective properties and the second layer has antireflective properties.

A1. The photovoltaic cell according to paragraph A0, wherein the first layer of each pixel has a first dimension and a first color, and wherein the second layer of each pixel has a second dimension different than the first dimension and a second color different than the first color, and is disposed such that the second layer is substantially aligned with the first layer.

A2. The photovoltaic cell according to paragraph A1, wherein the first layer causes light reflected from interior portions of the cell and incident on the first layer to be reflected back toward the semiconductor sheet.

A3. The photovoltaic cell according to paragraph A1, wherein the second layer reduces reflected glare from the cell.

A4. The photovoltaic cell according to paragraph A1, wherein the first dimension is larger than the second dimension, so that an outline of the first layer is visible around a perimeter portion of the second layer.

A5. The photovoltaic cell according to paragraph A4, wherein the first color is white and creates a white outline around the second layer, thereby improving contrast and visibility of the second layer.

A6. The photovoltaic cell according to paragraph A0, wherein the pixels are disposed on a cell-facing surface of the upper sheet.

A7. The photovoltaic cell according to paragraph A0, wherein the pixels are disposed on a radiation-incident surface of the upper sheet.

B0. A photovoltaic module, comprising:
  an optically transmissive upper sheet including a conductive grid pattern disposed on a surface of the upper sheet;
  at least two photovoltaic cells disposed with the conductive grid pattern in electrical contact with each of the cells to thereby electrically interconnect the cells; and
  a plurality of bi-layer pixels disposed on a surface of the upper sheet, wherein the pixels each include a first layer and a second layer, and wherein the first layer has reflective properties and is configured to reflect light incident on the first layer from interior portions of the module back to the cells.

B1. The photovoltaic module according to paragraph B0, wherein the second layer of each pixel has antireflective properties and is configured to reduce reflected glare from the module.

B2. The photovoltaic module according to paragraph B0, wherein the first layer of each pixel has a first dimension and a first color, and the second layer has a second dimension different than the first dimension and a second color different than the first color, and is disposed such that the second layer is substantially aligned with the first layer.

B3. The photovoltaic module according to paragraph B12, wherein the first color is white and creates a white outline around the second layer, thereby improving contrast and visibility of the second layer.

B4. The photovoltaic module according to paragraph B0, wherein the pixels are disposed on a cell-facing surface of the upper sheet.

B5. The photovoltaic module according to paragraph B0, wherein the pixels are disposed on a radiation-incident surface of the upper sheet.

C0. A photovoltaic cell, comprising:
  an optically transmissive upper sheet including a conductive grid pattern disposed on a surface of the upper sheet;
  an electricity-producing semiconductor sheet including a photoactive composition applied to a conductive substrate, disposed with the conductive grid pattern of the upper sheet in electrical contact with the semiconductor sheet; and
  at least one pixel disposed on a surface of the upper sheet, wherein the pixel includes a first layer configured to face generally toward the photoactive composition and a second layer configured to face generally away from the photoactive composition, and wherein the second layer is antireflective and is configured to reduce glare reflected from the upper sheet.

C1. The photovoltaic cell according to paragraph C0, wherein the first layer of the at least one pixel is reflective and is configured to reflect radiation incident upon the first layer toward the semiconductor sheet.

C2. The photovoltaic cell according to paragraph C0, wherein the at least one pixel includes a plurality of pixels configured in a dense pattern that substantially covers the upper sheet, thereby reducing visual contrast between the grid pattern and the semiconductor layer.

C3. The photovoltaic cell according to paragraph C0, wherein the at least one pixel is positioned to cover manufacturing defects such as blemishes in color or texture.

C4. The photovoltaic cell according to paragraph C0, wherein the first layer of the at least one pixel has a first dimension and a first color, and the second layer has a second dimension smaller than the first dimension and a second color less reflective than the first color.

C5. The photovoltaic cell according to paragraph C0, wherein the cell is electrically interconnected to at least one other photovoltaic cell by the grid pattern, to form a module.

D0. A method for manufacturing a photovoltaic cell including bi-layer pixels, comprising:
  providing an electricity-producing semiconductor sheet including a photoactive composition applied to a conductive substrate;
  providing an optically transmissive upper sheet including a conductive grid pattern disposed on a surface of the upper sheet;
  disposing the upper sheet so that the grid pattern is in electrical contact with the semiconductor sheet; and
  disposing a plurality of bi-layer pixels on a surface of the upper sheet, wherein the pixels each include a first layer and a second layer, and wherein the first layer has reflective properties and the second layer has antireflective properties.

D1. The method of paragraph D0, wherein the first layer of each pixel has a first dimension and a first color, and wherein the second layer of each pixel has a second dimension different than the first dimension and a second color different than the first color, and is disposed such that the second layer is substantially aligned with the first layer.

D2. The method of paragraph D1, wherein the first layer is configured to reflect light incident on the first layer from interior portions of the cell back toward the semiconductor sheet.

D3. The method of paragraph D1, wherein the second layer is configured to reduce glare reflected from the upper sheet.

D4. The method of paragraph D1, wherein the first dimension is larger than the second dimension, so that an outline of the first layer is visible around a perimeter portion of the second layer.

D5. The method of paragraph D4, wherein the first layer is white and creates a visible outline around a perimeter portion of the second layer, thereby improving contrast and visibility of the second layer.

D6. The method of paragraph D0, wherein the plurality of pixels is disposed on the upper sheet to create at least one desired visual element.

D7. The method of paragraph D0, wherein the pixels are disposed on a radiation incident surface of the upper sheet.

D8. The method of paragraph D0, wherein the pixels are disposed on a cell-facing surface of the upper sheet.

D9. The method of paragraph D0, further comprising electrically interconnecting the semiconductor sheet to at least one other semiconductor sheet by the grid pattern, to form a photovoltaic module.

E0. A method for manufacturing a photovoltaic device including bi-layer pixels, comprising:
   providing an optically transmissive upper sheet including a conductive grid pattern disposed on a surface of the upper sheet;
   providing at least one electricity-producing semiconductor sheet including a photoactive composition applied to a conductive substrate;
   disposing the upper sheet so that the grid pattern of the upper sheet is in electrical contact with the at least one semiconductor sheet;
   disposing a plurality of bi-layer pixels on a surface of the upper sheet, wherein the pixels each include a first layer configured to face generally toward the photoactive composition and a second layer configured to face generally away from the photoactive composition, and wherein the first layer is more reflective than the second layer.

E1. The method of paragraph E0, wherein the first layer of each pixel has a first dimension and a first color, and the second layer of each pixel has a second dimension smaller than the first dimension and a second color less reflective than the first color.

E2. The method of paragraph E0, wherein the first layer of each pixel is configured to reflect light incident on the first layer from interior portions of the cell back toward the semiconductor sheet.

E3. The method of paragraph E0, wherein the second layer of each pixel is configured to reduce glare reflected from the device.

E4. The method of paragraph E0, wherein the bi-layer pixels are disposed on the upper sheet to create at least one desired visual element on the upper sheet.

E5. The method of paragraph E0, wherein the bi-layer pixels are disposed on the upper sheet in a dense pattern to mask at least one underlying feature of the cell.

E6. The method of paragraph E5, wherein the first layer of each pixel has antireflective properties and is configured to mask the grid pattern of the upper sheet, thereby reducing visual contrast between the grid pattern and the semiconductor sheet.

E7. The method of paragraph E0, wherein the pixels are disposed on a radiation incident surface of the upper sheet.

E8. The method of paragraph E0, wherein the pixels are disposed on a cell-facing surface of the upper sheet.

E9. The method of paragraph E0, wherein the at least one semiconductor sheet comprises two or more semiconductor sheets that are electrically interconnected by the grid pattern, to form a photovoltaic module.

Advantages, Features, Benefits

The different embodiments of the PV devices and methods for manufacturing PV devices described herein provide several advantages over previous PV devices and methods for manufacturing PV devices including pixels disposed on a surface or within layers of the PV devices. For example, the illustrative embodiments described herein allow for disposal of pixels on PV devices to create visual elements having improved visibility and contrast, reduce glare reflected from the PV devices, and mask underlying features of the PV devices without compromising device performance. Additionally, and among other benefits, illustrative embodiments described herein allow for improvement of device performance. No known devices or methods can perform these functions, particularly in the various markets wherein the aesthetic appeal and/or functional properties of PV devices are of concern. Thus, the illustrative embodiments described herein are particularly useful for improving device aesthetics and/or performance where pixels are disposed on cells and/or modules for various purposes. However, not all embodiments described herein provide the same advantages or the same degree of advantage.

Conclusion

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. 5 Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original 10 claims, also are regarded as included within the subject matter of the invention(s) of the present disclosure.

What is claimed is:

1. A photovoltaic cell, comprising:
   an optically transmissive upper sheet defining a radiation-incident surface and a cell-facing surface, and including a conductive grid pattern disposed on the cell-facing surface of the upper sheet;
   an electricity-producing semiconductor sheet including a photoactive composition applied to a conductive substrate, disposed with the photoactive composition facing the cell-facing surface of the upper sheet, and with the photoactive composition in electrical contact with the conductive grid pattern of the upper sheet; and
   a plurality of bi-layer pixels disposed on the upper sheet, wherein the pixels each include a first layer disposed on the radiation-incident surface of the upper sheet and a second layer disposed on the first layer and separated from the upper sheet by the first layer;
   wherein the first layer has reflective properties and the second layer has antireflective properties; and
   wherein the first layer of each pixel has a first dimension and a first color, the second layer of each pixel has a second dimension smaller than the first dimension and a second color different than the first color, and the second layer is substantially centered with respect to the first layer, with an outline of the first layer visible around a perimeter portion of the second layer.

2. The photovoltaic cell according to claim 1, wherein the first layer causes light reflected from interior portions of the cell and incident on the first layer to be reflected back toward the semiconductor sheet.

3. The photovoltaic cell according to claim 1, wherein the second layer reduces reflected glare from the cell.

4. The photovoltaic cell according to claim 1, wherein the first color is white and creates a white outline around the second layer, thereby improving contrast and visibility of the second layer.

5. A photovoltaic module, comprising:
   two photovoltaic cells;

an optically transmissive upper sheet defining a radiation-incident surface and a cell-facing surface, including a conductive grid pattern disposed on the cell-facing surface, wherein the grid pattern overlaps and is in electrical contact with each of the cells to thereby electrically interconnect the cells; and a plurality of bi-layer pixels disposed on the radiation-incident surface of the upper sheet;

wherein the pixels each include a first layer disposed in contact with the radiation-incident surface of the upper sheet and a second layer disposed in contact with the first layer and separated from the upper sheet by the first layer, wherein the first layer has reflective properties and is configured to reflect light incident on the first layer from interior portions of the module back to the cells, and wherein the first layer of each pixel has a first dimension and a first color, the second layer has a second dimension smaller than the first dimension and a second color different than the first color, and the second layer is substantially centered with respect to the first layer, such that an outline of the first layer is visible around a perimeter portion of the second layer.

6. The photovoltaic module according to claim 5, wherein the second layer of each pixel has antireflective properties and is configured to reduce reflected glare from the module.

7. The photovoltaic module according to claim 5, wherein the first color is white and creates a white outline around the second layer, thereby improving contrast and visibility of the second layer.

8. A photovoltaic cell, comprising:
an optically transmissive upper sheet including a conductive grid pattern disposed on a cell-facing surface of the upper sheet;
an electricity-producing semiconductor sheet including a photoactive composition applied to a conductive substrate, disposed with the photoactive composition facing the cell-facing surface of the upper sheet and with the conductive grid pattern of the upper sheet in electrical contact with the semiconductor sheet; and
at least one pixel disposed on a radiation-incident surface of the upper sheet, wherein the pixel includes a first layer configured to face generally toward the photoactive composition and a second layer configured to face generally away from the photoactive composition, and wherein the second layer is antireflective and is configured to reduce glare reflected from the upper sheet; and
wherein the first layer has a first dimension and a first color, and the second layer has a second dimension smaller than the first dimension and a second color different from the first color, so that an outline of the first layer is visible around a perimeter portion of the second layer.

9. The photovoltaic cell according to claim 8, wherein the first layer of the at least one pixel is reflective and is configured to reflect radiation incident upon the first layer toward the semiconductor sheet.

10. The photovoltaic cell according to claim 8, wherein the at least one pixel includes a plurality of pixels configured in a dense pattern that substantially covers the upper sheet, thereby reducing visual contrast between the grid pattern and the semiconductor layer.

11. The photovoltaic cell according to claim 8, wherein the at least one pixel is positioned to cover manufacturing defects in the semiconductor sheet.

12. The photovoltaic cell according to claim 8, wherein the second color is less reflective to visible light than the first color.

13. The photovoltaic cell according to claim 8, wherein the cell includes a plurality of pixels arranged to form a pixelated visual element.

* * * * *